United States Patent
Huang

(10) Patent No.: US 9,315,893 B2
(45) Date of Patent: Apr. 19, 2016

(54) VAPOR DEPOSITION DEVICE

(71) Applicant: EverDisplay Optronics (Shanghai) Limited, Shanghai (CN)

(72) Inventor: ChunYun Huang, Shanghai (CN)

(73) Assignee: EVERDISPLAY OPTRONICS (SHANGHAI) LIMITED, Shanghai (CN)

(*) Notice: Subject to any disclaimer, the term of this patent is extended or adjusted under 35 U.S.C. 154(b) by 84 days.

(21) Appl. No.: 14/280,289

(22) Filed: May 16, 2014

(65) Prior Publication Data

US 2014/0345530 A1    Nov. 27, 2014

(30) Foreign Application Priority Data

May 21, 2013    (CN) .......................... 2013 1 0190867

(51) Int. Cl.
    C23C 16/00     (2006.01)
    C23C 14/56     (2006.01)
    H01L 51/00     (2006.01)

(52) U.S. Cl.
    CPC ............. *C23C 14/564* (2013.01); *H01L 51/001* (2013.01)

(58) Field of Classification Search
    CPC ........................... C23C 14/564; H01L 51/001
    USPC ........................................................ 118/727
    See application file for complete search history.

(56) References Cited

U.S. PATENT DOCUMENTS

| | | | |
|---|---|---|---|
| 4,526,132 A | 7/1985 | Ohta | |
| 5,584,973 A * | 12/1996 | Wada et al. | 204/192.12 |
| 2002/0011205 A1 * | 1/2002 | Yamazaki et al. | 118/620 |
| 2004/0139984 A1 | 7/2004 | Yamazaki et al. | |
| 2007/0234959 A1 * | 10/2007 | Nakanishi et al. | 118/720 |
| 2009/0081364 A1 | 3/2009 | Chung et al. | |
| 2013/0017320 A1 * | 1/2013 | Sonoda et al. | 427/66 |

FOREIGN PATENT DOCUMENTS

| | | |
|---|---|---|
| CN | 100999813 | 7/2007 |
| CN | 201031252 | 3/2008 |
| CN | 102011085 A | 4/2011 |
| CN | 201826007 | 5/2011 |

OTHER PUBLICATIONS

Chinese Office Action for Application No. 201310190867.3, issued on Dec. 1, 2014, 5 pages Chinese, 5 page English.

* cited by examiner

*Primary Examiner* — Keath Chen
(74) *Attorney, Agent, or Firm* — Andrew F. Young, Esq.; Lackenbach Siegel, LLP

(57) ABSTRACT

A vapor deposition device has a plurality of moving plates between the cooling plate and moving vapor deposition source is controlled by the blowout panel. Moreover, when the vapor deposition materials absorbed by the blowout panel are up to the predetermined value, the moving plates are rotated around their axis simultaneously by the linkage to form a new blowout panel for performing the subsequent vapor deposition process. Consequently, the adsorption ability of the blowout board is greatly improved, and the crack and peeling off of the blowout panel caused by absorbing too many vapor deposition materials are avoided. Hence, the volume production of the evaporative coating equipment is improved.

8 Claims, 4 Drawing Sheets

VAPOR DEPOSITION DEVICE

CROSS-REFERENCE TO RELATED APPLICATIONS

The present application claims priority to and the benefit of Chinese application number CN201310190867.3, filed on May 21, 2013. The entire content of which is incorporated herein by reference.

BACKGROUND OF THE INVENTION

1. Field of the Invention

The present disclosure relates to the technology of OLED, more specifically, to a vapor deposition device.

2. Description of the Related Art

Organic Light-Emitting Diode ("OLED" hereinafter) is also called Organic Electroluminescence Display which is composed of an extremely thin organic coating and a glass substrate. When the electrical current passes though OLED, the organic coating will emit light, i.e., OLED has the characteristic of self-luminous, moreover, the visual angle of the OLED display is large, and it can save the electricity significantly. Therefore, the OLED display has an incomparable advantage in comparison with the present LCD, which has been widely applied.

Presently, the OLED evaporative coating equipment is the customized machine, however the activation of the volume production is lower, which is the ratio of the possible production quantity and the actual production quantity in a machine. In the industry, the activation of the volume production is improved by the following means: increasing the volume of the vapor deposition materials in the evaporative process, for example, improving the volume of the crucible which is used for carrying the vapor deposition materials or designing the feeding device outside the chamber; forming the deposited film by vacuum vapor deposition with the Fine Metal Mask ("FMM", hereinafter) evaporating technology.

FIG. 1 shows a structure diagram of the vapor deposition process adopting the traditional blowout panel. A Moving Vapor Deposition Source 15 moves along the lengthways direction of Moving Device 16 to perform the vapor deposition process on a Substrate 11. When Moving Vapor deposition Source 15 moves below Substrate 11 and the vapor deposition process is accomplished, Moving Vapor deposition Source 15 comes back to the location for vapor depositing along the lengthways direction of Moving Device 16. Since Vapor Deposition Materials 17 are sprayed by Moving Vapor deposition Source 15 during all the time of its movement, i.e., the Vapor Deposition Materials 17 is sprayed onto the lower surface of the blowout panel, and the adsorption ability of the lower surface of Blowout Panel 14 is limited, Vapor Deposition Materials 17 absorbed by the lower surface of Blowout Panel 14 will crack and even peel off after a long time of being vapor deposited, which affects the stability of the vapor deposition process.

Sand Blasting Treatment or Molten Aluminium Splash Treatment are adopted to improve the adsorption ability of the blowout panel in the vapor deposition process, however the problem that the vapor deposition materials will crack and even peel off after a long time of being vapor deposited is not solved. Moreover, the vapor deposition materials deposited upon the blowout panel can peel off to the vapor deposition source, thereby affecting the uniformity of the films and reducing the performance and the yield of products.

A related art has disclosed a deposition device, which comprises a crucible with a gas outlet on the top for holding a deposition material, and a lining around the gas outlet with a hole corresponding to the gas outlet. The hole of the lining has zigzag structure at the inner wall. The deposition device can prevent the deposition material from being contaminated.

Another related art has disclosed a method for processing the surface of an attachment-resisting plate. The method comprises the following steps: providing an attachment-resisting plate with a smooth surface; patterning the attachment-resisting surface of the attachment-resisting plate with a smooth surface to form an uneven attachment-resisting surface; blasting the attachment-resisting surface; and meltallizing the attachment-resisting surface after blasting. The smooth surface of the attachment-resisting plate is subject to the patterning, the blasting and the meltallizing so that the surface of the attachment-resisting plate has corrosion resistance, rust prevention, abrasion resistance, lubrication, roughness, adsorption, insulation, heat insulation and other properties; the attachment-resisting surface of the attachment-resisting plate achieves even roughness; and the attachment-resisting plate can easily absorb target atoms or large-sized particles so that the target atoms or large-sized particles do not fall on a substrate, thereby increasing the sediment capability of the attachment-resisting plate and prolonging the service life of the attachment-resisting plate.

Consequently, the related arts did not solve the problem that the vapor deposition materials will crack and even peel off after a long time of being vapor deposited.

SUMMARY OF THE INVENTION

An aspect of an embodiment of the present disclosure is directed toward a vapor deposition device capable of greatly improving the adsorption ability of the blowout panel, avoiding the peeling off or crack of the blowout panel caused by absorbing too many vapor deposition materials, and improving the volume production of evaporative coating equipment.

A vapor deposition device having a moving vapor deposition source, the vapor deposition device comprising:

a cooling plate adapted to be securely installed on the moving vapor deposition source; and a plurality of moving plates rotatably installed on the cooling plate by a fixing device;

wherein, the moving plates rotate around the fixing device simultaneously, which forms blowout panels.

According to one embodiment of the present disclosure, wherein each surface of the moving plates is treated by Sand Blasting Treatment or Molten Aluminum Splash Treatment.

According to one embodiment of the present disclosure, wherein each of the moving plates rotates around a geometric centerline of its own.

According to one embodiment of the present disclosure, wherein the moving plates are evenly distributed on the cooling plate.

According to one embodiment of the present disclosure, wherein each of the moving plates are I-shaped and has a size the same as the others; the I-shaped moving plate comprises a standing board and two protrude structures located on two ends of the standing board respectively; the protrude structures located in two adjacent moving plates are arranged in staggered formation, and the distance of the two adjacent moving plates is larger than a predetermined value; wherein the predetermined value depends on condensation parameters of the vapor deposition materials.

According to one embodiment of the present disclosure, wherein each of the moving plates is cuboid and has a uniform size the same as others; a surface of the cuboid is perpendicular to a lower surface of the cooling plate; a distance between two adjacent moving plates is larger than a first predetermined value; a long side of the surface of each of the moving plates is parallel to a low surface of each of the cooling plates; wherein, the first predetermined value depends on condensation parameters of vapor deposition materials and the size of the cuboid.

According to one embodiment of the present disclosure, wherein each of the moving plates is cuboid and has a uniform size the same as others; a surface of the cuboid is perpendicular to a lower surface of the cooling plate; a distance between two adjacent moving plates is larger than a second predetermined value; a sidewall of each of the moving plates is parallel to a low surface of each of the cooling plates; wherein, the second predetermined value depends on condensation parameters of vapor deposition materials and the size of the cuboid.

According to one embodiment of the present disclosure, wherein each of the moving plates is tetrahedron and has a uniform size the same as others; a subface of the tetrahedron is perpendicular to a lower surface of the cooling plate; a distance between two adjacent moving plates is larger than a third predetermined value, a sidewall of each of the moving plates is parallel to a low surface of each of the cooling plates; wherein, the third predetermined value depends on condensation parameters of vapor deposition materials and the size of the tetrahedron.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTIONS

Figure 1:
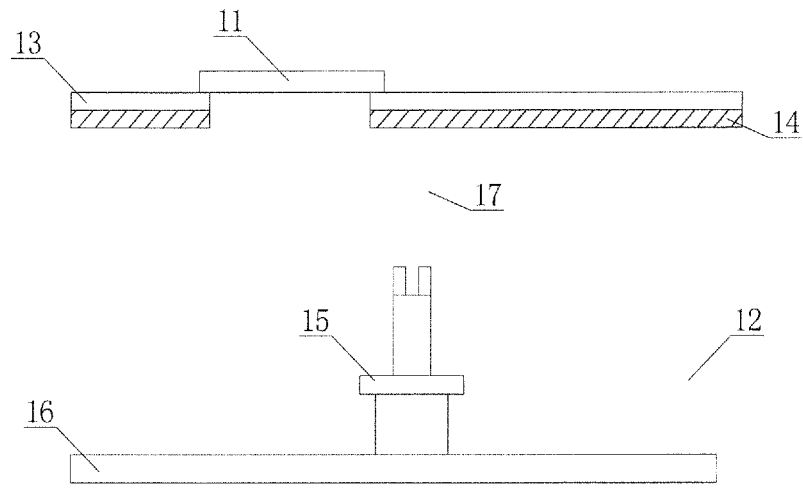
FIG. 1 shows a structure diagram of the vapor deposition process using the traditional blowout panel.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Embodiment 1

Figure 2:
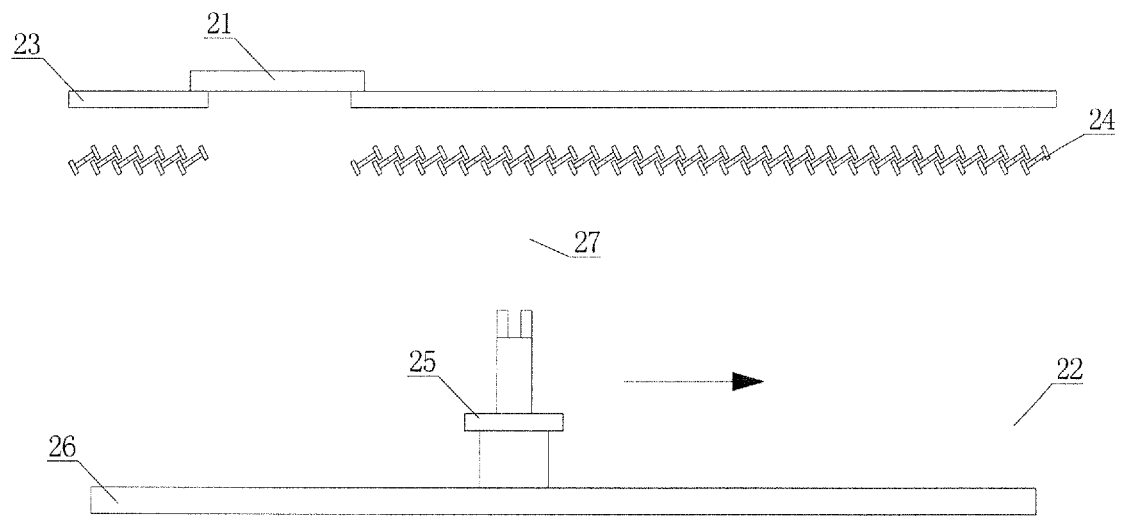
FIG. 2 shows a structure diagram of the blowout panel which is made up of a plurality of I-shaped moving plates in Embodiment 1.
Figure 3:
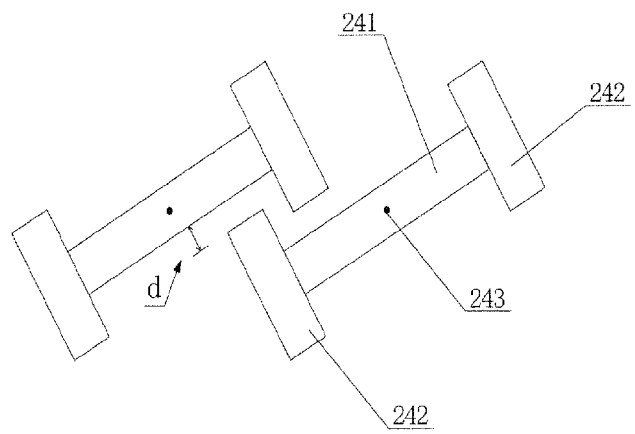
FIG. 3 shows a structure diagram of I-shaped moving plate in Embodiment 1.

FIG. 2 shows a structure diagram of the blowout panel which is made up of a plurality of the I-shaped moving plates in Embodiment 1; FIG. 3 shows a structure diagram of I-shaped moving plate in Embodiment 1. As shown in FIGS. 2 and 3, a vapor deposition device is set in the OLED evaporation coating equipment. A plurality of Cooling Plates 23 is fixed inside the evaporation coating equipment. A soft or hard Substrate 21, such as the glass substrate, is placed in the area for vapor deposition between two adjacent Cooling Plates 23. A plurality of I-shaped Moving Plates 24 is set below each Cooling Plate 23. The I-shaped Moving Plates 24 are regularly arranged to form the blowout panel. Moving Device 26 is set below the blowout panel. Moving Vapor Deposition Source 25 moves on Moving Device 26. Moving Device 26 is a guile rail, a threaded rod or a mechanical arm and so on.

As shown in FIG. 3, each I-shaped Moving Plate 24 comprising: a Standing Board 241 and two Protrude Structures 242 located on the two ends of the Standing Board 241 respectively; a Fixing Device 243 set on the geometrical axis of Moving Plate 24; and a linkage (not shown) controlling a plurality of I-shaped Moving Plates 24 to rotate around Fixing Device 243 synchronously, by which each Moving Plate 24 is sloped at a certain angle and fixed (as shown in FIG. 2, at the moment, Standing Board 241 is set perpendicular to Cooling Plate 23, Moving Plates 24 is clockwise rotated for 30° to 60°, such as 30°, 45° or 60°); next, the adjacent Protrude Structures 242 in two adjacent Moving Plates 24 are arranged in staggered formation to form a blowout panel, which separates Moving Vapor Deposition Source 25 from Cooling Plate 23. The two adjacent Moving Plates 24 are not mutually contacted, i.e., the distance between the two adjacent Moving Plates 24 is larger than a predetermined value d. The predetermined value d depends on the coagulation parameters of the vapor deposition materials in the vapor deposition process. When the surface of the Moving Plate 24 has absorbed a certain amount of Vapor Deposited Materials 27, Vapor Deposited Materials 27 absorbed at the surfaces of the two adjacent Moving Plates 24 will not be congealed together to avoid the peeling off of the blowout panel and the disadvantageous effect of the quality of the vapor deposition process.

Preferably, the length of the above Protrude Structure 242 depends on the predetermined value d, which forms the blowout board separating Cooling Plate 23. When Moving Vapor Deposition Source 25 sprays Vapor Deposition Materials 27 to the blowout panel, few Vapor Deposition Materials 27 are sprayed to the surface of the Cooling Plate 23 to remain the cleanliness thereof.

Furthermore, the above blowout panel is adopted in the vapor deposition process for a period of time, when the Vapor Deposition Materials 27 adsorbed at the surface of Moving Plate 24 rises up to a certain thickness, a plurality of Moving Plates 24 are controlled to rotate around these axis synchronously by the linkage to form another blowout panel (for example, counterclockwise rotate the same angle as the last rotation); next, the vapor deposition process is continued. Since the two blowout panels are formed by the synchronous rotations of a plurality of Moving Plates 24, and the superficial area of Vapor Deposition Materials 27 absorbed at the blowout panel whose surface are provided with the larger concave-convex structure is much larger than that of the traditional blowout panel whose surface is flat, the absorption ability thereof is more than twice as that of the traditional blowout panel. When the conversion time of the blowout panel is very short, even when thin film is deposited on the soft or hard substrate by Moving Vapor Deposition Source 25, the blowout panel can be converted, i.e., the blowout panel can be converted without stopping the machine. Therefore, the volume production of evaporative coating equipment is further improved.

Embodiment 2

Figure 4:
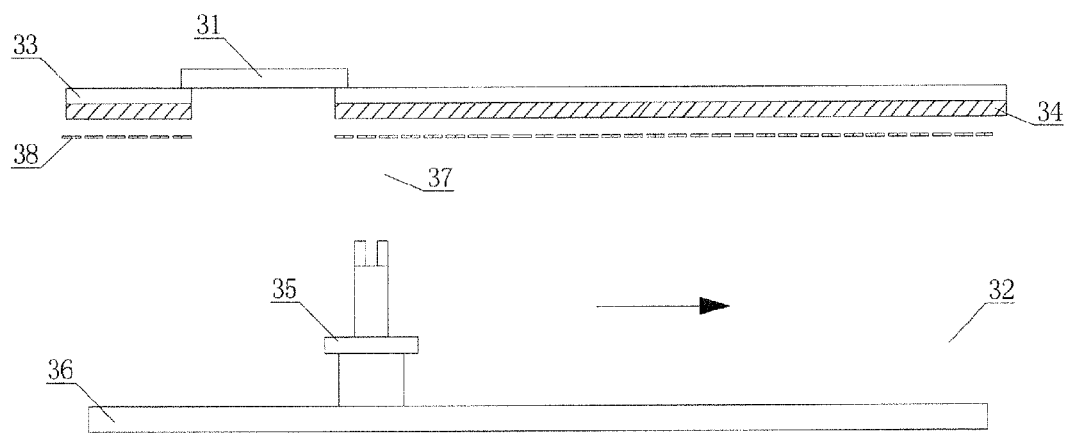
FIG. 4 shows a structure diagram of the blowout panel which is made up of a plurality of moving plates in Embodiment 2.
Figure 5:
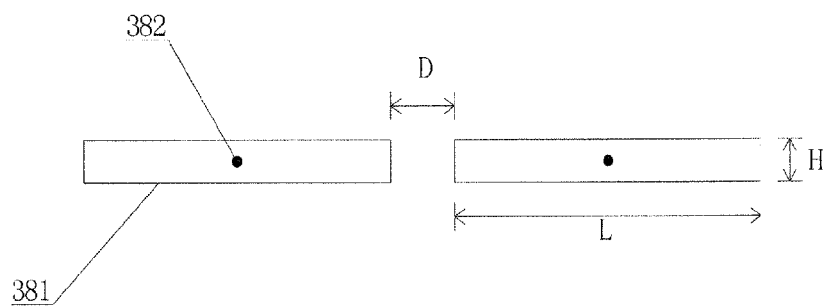
FIG. 5 shows a structure diagram of the moving plate in Embodiment 2.

FIG. 4 shows a structure diagram of the blowout panel which is made up of a plurality of moving plates in Embodiment 2. FIG. 5 shows a structure diagram of the moving plate in Embodiment 2. As shown in FIGS. 4 and 5, a vapor deposition device comprising: a Moving Device 36 set in the OLED evaporative coating equipment; a plurality of Cooling Plate 33 fixed above Moving Device 36; a soft or hard Substrate 31 set in the area for vapor depositing between the two adjacent Cooling Plates 33; a plurality of Moving Plates 381 capable of rotating set below Cooling Plate 33 by Fixing Device 382; a linkage (not shown) for controlling a plurality of Moving Plates 381 to rotate around their geometric centerline where Fixing Device 381 is located to form the Blowout Panel 38; a Moving Vapor Deposition Source 35 moving on Moving Device 36 for performing the vapor deposition process on the soft or hard Substrate 31. Wherein, Moving Device 36 is a guile rail, a threaded rod or a mechanical arm and so on.

Furthermore, each of the Moving Plates 381 is the cuboid and having a size the same as the others, i.e., the subface of the moving thin plate is rectangle. A subface of the cuboid is perpendicular to a low surface of Cooling Plate 33(the moving plate rotates around its geometric centerline). A distance between two adjacent Moving Plates 381 is larger than a first predetermined value D. A long side of the subface of each of Moving Plates 381 is parallel to a lower surface of Cooling Plate 33 to form the blowout panel 38 whose surface is parallel with the surface of Cooling Plate 33, thereby Cooling Plate 33 will be prevented from most of Vapor Deposition Materials 37 sprayed by Moving Vapor Deposition Source 35. Wherein, the first predetermined value D depends on the condensation parameter of the vapor deposition materials and the size of the cuboid, i.e., the first predetermined value D is larger than the condensation parameter of Vapor Deposition Materials 37. To avoid the peeling off of the vapor deposition materials absorbed by the moving plate which is rotating, it should satisfies the formula $D>2(\sqrt{L^2+H^2}-L)$, L denotes the length of the subface of the Moving Plate 381, H denotes the thickness of the subface of Moving Plate 381. Hence, a new blowout panel can be formed by Moving Plate 318 rotating around its axis.

Preferably, to maintain the cleanliness of Cooling Plate 33, a general Blowout Board 34 can be set between Cooling Plate 33 and Blowout Panel 38 to absorb the residual sprayed vapor deposition materials after the preventing of the Blowout Panel 38.

Specifically, in the vapor deposition process, when the surface of the soft or hard Substrate 31 has been treated by the vapor deposition process, and in the course of Moving Vapor Deposition Source 35 moving along the Moving Device 36 to Position 32 for vapor depositing, Moving Vapor Deposition Source 35 continues spraying Vapor Deposition Materials 37 upward. To avoid the problem that sprayed Vapor Deposition Materials 37 may affect the vapor deposition process, a plurality of Moving Plates 381 are controlled to rotate around their axis by the linkage between the soft or hard Substrate 31 and the position for vapor depositing. Therefore, the widest surfaces are all in parallel with the surface of Cooling Plate 33 to compose Blowout Panel 38 for adsorbing Vapor Deposition Materials 37 sprayed by Vapor Deposition Source 35. The Blowout Board 34 adsorbs the residual vapor deposition materials after the adsorption of Blowout Panel 38. When the vapor deposition process has been performed for a period of time, and the Vapor Deposition Material 37 adsorbed by Blowout Panel 38 has been up to the estimated thickness (before the surface of Blowout Panel 38 creaks), a plurality of Moving Plates 381 is controlled by the linkage to rotate around their axis for 180° to form a new blowout panel.

Since the distance D between the two adjacent moving plates is larger than the condensation parameter of the vapor deposition materials, and $D>2(\sqrt{L^2+H^2}-L)$, the adsorbed vapor deposition materials will not peel off while the moving plate is rotating. The adsorption ability of the device of the technical scheme in the present embodiment is increased twice larger than that of the traditional processing equipment by means of using the two blowout panels in turn. And as the time of the conversion of the two blowout panels is shorter, even when thin film is deposited on the soft or hard substrate by Moving Vapor Deposition Source 35, the blowout panel can be converted, i.e., the blowout panel can be converted without stopping the machine. Therefore, the volume production of evaporative coating equipment is further improved.

Embodiment 3

Figure 6:
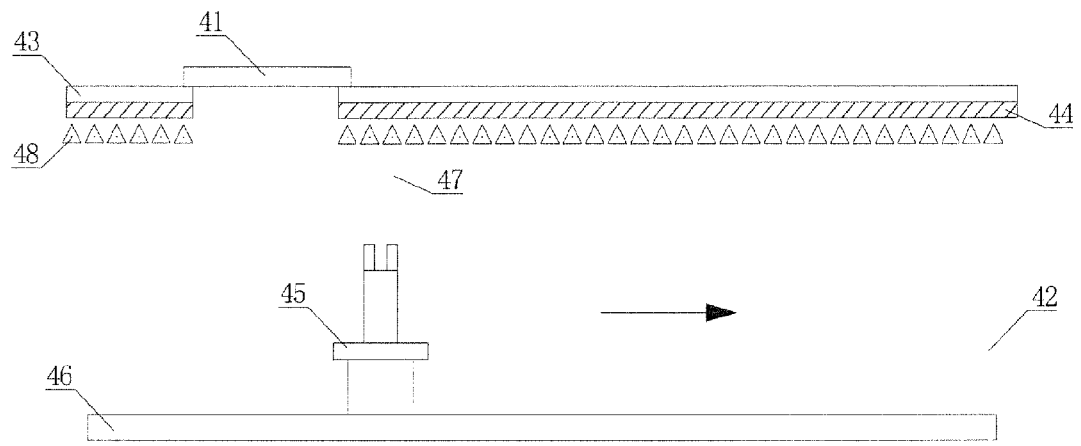
FIG. 6 shows a structure diagram of the blowout panel which is made up of a plurality of moving plates in Embodiment 3.
Figure 7:
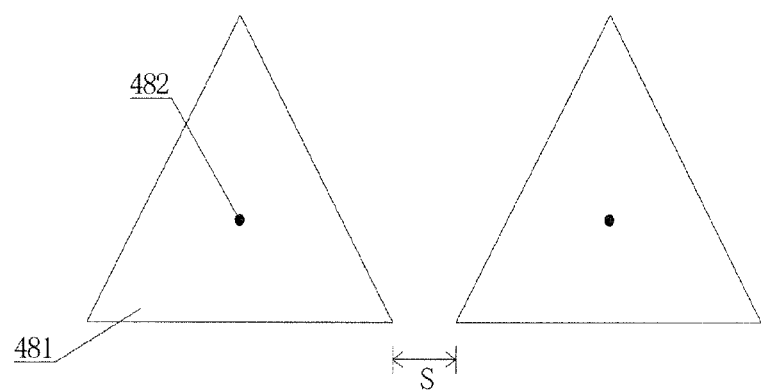
FIG. 7 shows a structure diagram of the moving plates in Embodiment 3.

FIG. 6 shows a structure diagram of the blowout panel which is made up of a plurality of the moving plates in Embodiment 3. FIG. 7 shows a structure diagram of the moving plates in Embodiment 3. As shown in FIG. 6 and FIG.

7, based on Embodiment 2, a vapor deposition device comprising: a Moving Device 46 set in the OLED evaporative coating equipment; a plurality of Cooling Plates 43 set above Moving Device 46; a soft or hard Substrate 41 set in the area for vapor depositing between two adjacent Cooling Plates 43; a plurality of Moving Plates 481 capable of rotating set below Cooling Plate 43 by Fixing Device 482; a linkage (not shown) for controlling Moving Plates 481 to rotate around their geometric centerline where Fixing Device 482 located to form Blowout Panel 48; a Moving Vapor Deposition Source 45 moving on Moving Device 46 for performing the vapor deposition process to the soft or hard Substrate 41. Wherein, Moving Device 46 is a guile rail, a threaded rod or a mechanical arm and so on.

Furthermore, each of Moving Plates 481 is the tetrahedron and having a uniform size the same as others, i.e., the subface of Moving Plate 481 is regular triangle, and a subface is perpendicular to a lower surface of Cooling Plate 43 (Moving Plates 481 rotate around their geometric centerline). A distance between two adjacent Moving Plates 481 is larger than a third predetermined value S, and a sidewall of each of the Moving Plates 481 is parallel to the low surface of each of the cooling plates to form Blowout Panel 48 whose surface is parallel with the surface of Cooling Plate 43. Thereby, Cooling Plates 43 are prevented from the most Vapor Deposition Materials 47 sprayed by Moving Vapor Deposition Source 45, wherein the third predetermined value S depends on the condensation parameter of Vapor Deposition Materials 47 and the size of the tetrahedron, i.e., the third predetermined value S is lager than the condensation parameter of Vapor Deposition Materials 47 in order to avoid the peeling off of Vapor Deposition Materials 47 absorbed at Moving Plates 481. Two adjacent Moving Plates 481 will not mutually contact while rotating around their axis, thereby Moving Plates 481 can form a new blowout panel by rotating around their axis.

Preferably, to maintain the cleanliness of Cooling Plate 43, a general Blowout Board 44 can be set between Cooling Plate 43 and Blowout Panel 48 to absorb the residual sprayed vapor deposition materials after the preventing of the Blowout Panel 38, wherein, the thickness of the blowout board can be reduced.

Specifically, in the vapor deposition process, when the surface of the soft or hard Substrate 41 has been treated by the vapor deposition process, and in the course of Moving Vapor Deposition Source 45 moving along the Moving Device 46 to Position 42 for vapor depositing, Moving Vapor Deposition Source 45 continues spraying Vapor Deposition Materials 47 upward. To avoid the problem that sprayed Vapor Deposition Materials 47 may affect the vapor deposition process, a plurality of Moving Plates 481 are controlled to rotate around their axis by the linkage between the soft or hard Substrate 41 and Position 42 for vapor depositing. Therefore, the widest surfaces are all in parallel with the surface of Cooling Plate 43 to compose Blowout Panel 48 for adsorbing Vapor Deposition Materials 47 sprayed by Vapor Deposition Source 45. The Blowout Board 44 adsorbs the residual vapor deposition materials after the adsorption of Blowout Panel 48. When the vapor deposition process has been performed for a period of time, and the Vapor Deposition Material 47 adsorbed by Blowout Panel 48 has been up to the estimated thickness (before the surface of Blowout Panel 48 creaks), a plurality of Moving Plates 481 are controlled by the linkage to rotate around their axis for 120° to form the new blowout panel. The rest can be done in the same manner, Moving Plates 481 will be washed and replaced until three of the sidewalls have adsorbed the Vapor Deposition Materials.

Since the distance S between the two adjacent Moving Plates 481 is larger than the condensation parameter of the vapor deposition materials, and two adjacent Moving Plates 481 will not mutually contact while rotating around their axis, the adsorbed vapor deposition materials will not peel off while two adjacent Moving Plates 481 are rotating. The adsorption ability of the device of the technical scheme in the present embodiment is increased three times larger than that of the traditional processing equipment by means of using the three blowout panels in turn. And as the time of the conversion of the three blowout panels is shorter, even when thin film is deposited on the soft or hard substrate by Moving Vapor Deposition Source 45, the blowout panel can be converted, i.e., the blowout panel can be converted without stopping the machine. Therefore, the volume production of evaporative coating equipment is further improved.

Embodiment 4

Figure 8:
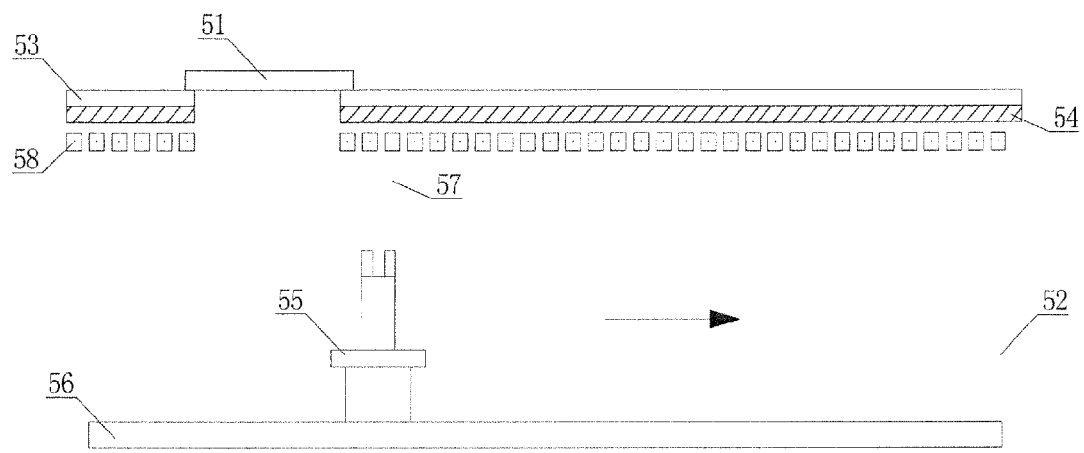
FIG. 8 shows a structure diagram of the plurality of which is made up of a plurality of moving plates whose subfaces are square in Embodiment 4.
Figure 9:
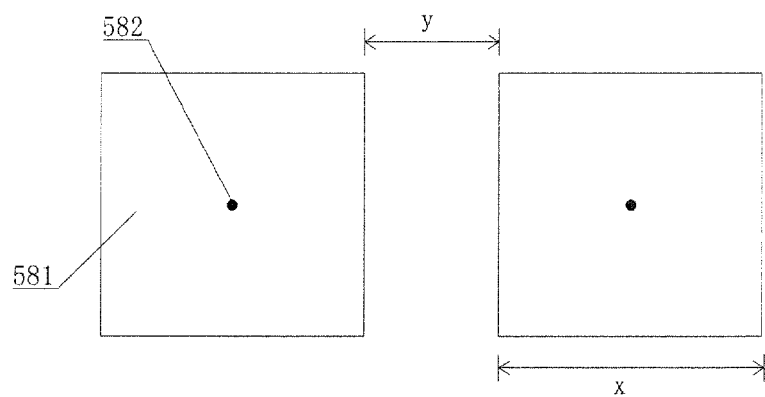
FIG. 9 shows a structure diagram of the moving plates whose subfaces are square in Embodiment 4.

FIG. 8 shows a structure diagram of the blowout panel which is made up of a plurality of the moving plates whose subfaces are square in Embodiment 4. FIG. 9 shows a structure diagram of the moving plates whose subfaces are square in Embodiment 4. As shown in FIGS. 8 and 9, a device for vapor depositing comprising: a Moving Device 56 set in the OLED evaporative coating equipment; a plurality of Cooling Plates 53 set above the Moving Device 56; a soft or hard Substrate 51 set in the area for vapor depositing between two adjacent Cooling Plates 53; a plurality of Moving Plates 581 whose subfaces are square, capable of rotating, and set below Cooling Plate 53 by the Fixing Device 582; a linkage (not shown) for controlling Moving Plates 581 whose subface is square to rotate around their geometric centerline where the Fixing Device 582 located to form Blowout Panel 58; a Moving Vapor Deposition Source 55 moving on Moving Device 56 for performing the vapor deposition process to the soft or hard Substrate 51, wherein, the Moving Device 56 is a guile rail, a threaded rod or a mechanical arm and so on.

Furthermore, each of Moving Plates 581 whose subface is square is the cuboid whose size is same, and the subface of Moving Plates 581 is perpendicular to a lower surface of each of Cooling Plates 53 (Moving Plates 581 rotate around their geometric centerline). The distance between two adjacent Moving Plates 581 is larger than a second predetermined value y, and a side of each of Moving Plates 581 is parallel to a low surface of each of the cooling plates to form Blowout Panel 58 whose surface is parallel to the surface of Cooling Plate 53. Thereby, Cooling Plates 53 are prevented from the most Vapor Deposition Materials 57 sprayed by Moving Vapor Deposition Source 55, wherein, the second predetermined value y depends on the condensation parameter of Vapor Deposition Materials 57 and the size of the cuboid, i.e., the second predetermined value y is lager than the condensation parameter of Vapor Deposition Materials 57 in order to avoid peeling off of the vapor deposition materials absorbed at Moving Plates 581. Furthermore, the second predetermined value (y) needs to meet the formula: $y>(\sqrt{2}-1)x$, x denotes the side length of the subface of Moving Plates 581. Consequently, Moving Plates 581 can form a new blowout panel by rotating around their axis.

Preferably, to maintain the cleanliness of Cooling Plate 53, a general Blowout Board 54 can be set between Cooling Plate 53 and Blowout Panel 58 to absorb the residual sprayed vapor deposition materials after the preventing of the Blowout Panel 58, wherein the thickness of Blowout Board 54 can be reduced.

Specifically, in the vapor deposition process, when the surface of the soft or hard Substrate 51 has been treated by the vapor deposition process, and in the course of Moving Vapor Deposition Source 55 moving along the Moving Device 56 to Position 52 for vapor depositing, Moving Vapor Deposition Source 55 continues spraying Vapor Deposition Materials 57 upward. To avoid the problem that sprayed Vapor Deposition Materials 57 may affect the vapor deposition process, a plurality of Moving Plates 581 are controlled to rotate around their axis by the linkage between the soft or hard Substrate 51 and Position 52 for vapor depositing. Therefore, the widest surfaces are all in parallel with the surface of Cooling Plate 53 to compose the Blowout Panel 58 for adsorbing Vapor Deposition Materials 57 sprayed by Vapor Deposition Source 55. The Blowout Board 54 adsorbs the residual vapor deposition materials after the adsorption of Blowout Panel 58. When the vapor deposition process has been performed for a period of time, and the Vapor Deposition Material 57 adsorbed by Blowout Panel 58 has been up to the estimated thickness (before the surface of Blowout Panel 48 creaks), a plurality of Moving Plates 581 are controlled by the linkage, such as a connecting rod, to rotate around their axis for 90° to form the new blowout panel. Each conversion sequence of the blowout panel is same, for example, the blowout panel is converted by the means of clockwise rotating for 90° or counterclockwise rotating for 90°. The rest can be done in the same manner, Moving Plates 581 will be washed and replaced until four of the sidewalls have adsorbed the vapor deposition materials.

Since the distance (y) between the two adjacent Moving Plates 581 is larger than the condensation parameter of the vapor deposition materials, and $y > (\sqrt{2}-1)x$, the adsorbed vapor deposition materials will not peel off while two adjacent Moving Plates 581 are rotating. The adsorption ability of the device of the technical scheme in the present embodiment is increased four times larger than that of the traditional processing equipment by means of using the four blowout panels in turn. And as the time of the conversion of the three blowout panels is shorter, even when thin film is deposited on the soft or hard Substrate 51 by Moving Vapor Deposition Source 55, the blowout panel can be converted, i.e., the blowout panel can be converted without stopping the machine. Therefore, the volume production of evaporative coating equipment is further improved.

Furthermore, the outside surfaces of each moving plate in the above embodiments are treated by Sand Blasting Treatment or Molten Aluminum Splash Treatment or are provided with a structure of rugged. Consequently, the adsorption ability is improved.

As a plurality of moving plate are controlled by the linkage, at least two blowout panels may be formed between the cooling plate and the moving vapor deposition source. When the vapor deposition materials absorbed by a blowout panel has been up to the predetermined value, a plurality of moving plate are controlled again by the linkage to rotate synchronously. Consequently, a new blowout panel for the continuing vapor depositing is formed. Hence, the adsorption ability of the blowout panel is greatly improved, and the peeling off or crack of the blowout panel caused by absorbing too many vapor deposition materials is avoided. Therefore, the volume production of evaporative coating equipment is improved.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A vapor deposition device having a moving vapor deposition source for coating on a substrate, the vapor deposition device comprising:
    the moving vapor deposition source is movable in a first direction;
    a cooling plate adapted to be securely installed over the moving vapor deposition source;
    the substrate placed at an opening of the cooling plate; and
    a plurality of moving plates arranged in the first direction rotatably installed between the cooling plate and the vapor deposition source by a fixing device except in front of the opening of the cooling plate;
    wherein, the moving plates rotate around the fixing device simultaneously, which forms blowout panels.

2. The device as claimed in claim 1, wherein each surface of the moving plates is treated by Sand Blasting Treatment or Molten Aluminum Splash Treatment.

3. The device as claimed in claim 1, wherein each of the moving plates rotates around a geometric centerline of its own.

4. The device as claimed in claim 1, wherein the moving plates are evenly distributed on the cooling plate.

5. The device as claimed in claim 4, wherein each of the moving plates are I-shaped and has a size the same as the others; the I-shaped moving plate comprises a standing board and two protrude structures located on two ends of the standing board respectively; the protrude structures located in two adjacent moving plates are arranged in staggered formation, and the distance of the two adjacent moving plates is larger than a predetermined value; wherein the predetermined value depends on condensation parameters of the vapor deposition materials.

6. The device as claimed in claim 4, wherein each of the moving plates is cuboid and has a uniform size the same as others; a surface of the cuboid is perpendicular to a lower surface of the cooling plate; a distance between two adjacent moving plates is larger than a first predetermined value; a long side of the surface of each of the moving plates is parallel to a low surface of each of the cooling plates; wherein, the first predetermined value depends on condensation parameters of vapor deposition materials and the size of the cuboid.

7. The device as claimed in claim 4, wherein each of the moving plates is cuboid and has a uniform size the same as others; a surface of the cuboid is perpendicular to a lower surface of the cooling plate; a distance between two adjacent moving plates is larger than a second predetermined value; a sidewall of each of the moving plates is parallel to a low surface of each of the cooling plates; wherein, the second predetermined value depends on condensation parameters of vapor deposition materials and the size of the cuboid.

8. The device as claimed in claim 4, wherein each of the moving plates is tetrahedron and has a uniform size the same as others; a surface of the tetrahedron is perpendicular to a lower surface of the cooling plate; a distance between two adjacent moving plates is larger than a third predetermined value, a sidewall of each of the moving plates is parallel to a low surface of each of the cooling plates; wherein, the third predetermined value depends on condensation parameters of vapor deposition materials and the size of the tetrahedron.

* * * * *